(12) United States Patent
Teboulle

(10) Patent No.: US 10,989,744 B2
(45) Date of Patent: Apr. 27, 2021

(54) ELECTRICAL ENERGY METER COMPRISING A CURRENT-MEASURING CIRCUIT AND A VOLTAGE-MEASURING CIRCUIT

(71) Applicant: SAGEMCOM ENERGY & TELECOM SAS, Rueil-Malmaison (FR)

(72) Inventor: Henri Teboulle, Rueil-Malmaison (FR)

(73) Assignee: Sagemcom Energy & Telecom SAS, Rueil Malmaison (FR)

( * ) Notice: Subject to any disclaimer, the term of this patent is extended or adjusted under 35 U.S.C. 154(b) by 0 days.

(21) Appl. No.: 17/044,847

(22) PCT Filed: Apr. 18, 2019

(86) PCT No.: PCT/EP2019/060074
§ 371 (c)(1),
(2) Date: Oct. 1, 2020

(87) PCT Pub. No.: WO2019/202075
PCT Pub. Date: Oct. 24, 2019

(65) Prior Publication Data
US 2021/0048458 A1    Feb. 18, 2021

(30) Foreign Application Priority Data

Apr. 20, 2018  (FR) .................... 18 53525

(51) Int. Cl.
*G01R 21/133*    (2006.01)
*G01R 35/00*     (2006.01)
*G01R 21/00*     (2006.01)

(52) U.S. Cl.
CPC ......... *G01R 21/133* (2013.01); *G01R 21/003* (2013.01); *G01R 35/005* (2013.01)

(58) Field of Classification Search
CPC    G01R 19/2513; G01R 21/133; G01R 21/003; G01R 21/06; G01R 35/005; G01R 35/04; G01R 22/10; G01R 15/142
See application file for complete search history.

(56) References Cited

U.S. PATENT DOCUMENTS 7,511,468 B2 * 3/2009 McEachern ........ G01R 19/2513
324/74
2003/0036864 A1  2/2003 Randall et al.
(Continued)

FOREIGN PATENT DOCUMENTS

CN    103869210 A    6/2014
CN    107037261 A    8/2017
(Continued)

OTHER PUBLICATIONS

International Search Report (with English translation) and Written Opinion dated Jul. 29, 2019 issued in corresponding Application No. PCT/EP2019/060074.

*Primary Examiner* — Giovanni Astacio-Oquendo
*Assistant Examiner* — Dustin R Dickson
(74) *Attorney, Agent, or Firm* — Muncy, Geissler, Olds & Lowe, P.C.

(57) ABSTRACT

The invention relates to an electrical energy meter comprising a current-measuring circuit and a voltage-measuring circuit, the current-measuring circuit comprising a current sensor producing a first analog measuring voltage and a first analog-to-digital converter arranged so as to carry out a first sampling of the first analog measuring voltage in a such a way as to produce first digital values, and the voltage-measuring circuit comprising a voltage sensor-producing a second analog measuring voltage and a second analog-to-digital converter arranged so as to carry out a second sampling of the second analog measuring voltage in such a way as to produce second digital values, the electrical (Continued)

energy meter also comprising a first synchronization circuit arranged so as to synchronize the frequency of the first sampling and the second sampling.

13 Claims, 2 Drawing Sheets

(56) References Cited

U.S. PATENT DOCUMENTS

| | | |
|---|---|---|
| 2008/0215262 A1 | 9/2008 | Rzehak |
| 2012/0078555 A1* | 3/2012 | Banhegyesi ......... G01R 21/133 |
| | | 702/64 |
| 2012/0169300 A1 | 7/2012 | Rouaud et al. |
| 2014/0218008 A1 | 8/2014 | Ewing et al. |
| 2017/0184697 A1 | 6/2017 | Kostrba et al. |
| 2019/0072596 A1* | 3/2019 | Steuer ................. G01R 21/133 |

FOREIGN PATENT DOCUMENTS

| | | |
|---|---|---|
| GB | 2347225 A | 8/2000 |
| WO | WO-01/55733 A1 | 8/2001 |
| WO | WO-2018/022552 A1 | 2/2018 |

\* cited by examiner

ELECTRICAL ENERGY METER COMPRISING A CURRENT-MEASURING CIRCUIT AND A VOLTAGE-MEASURING CIRCUIT

The invention relates to the field of electricity meters including a current-measurement circuit and a voltage-measurement circuit.

BACKGROUND OF THE INVENTION

Electricity meters of class D, which are intended for heavy industrial use, conventionally measure currents that are very high, sometimes greater than 1000 amps (A).

Such a meter is thus generally connected to one or more phase conductors of a distribution network via one or more external transformers connected to the phase conductors. Typically, those external transformers present a transformation ratio lying in the range 100 to 1000.

In a meter connected to a distribution network via an external transformer, it is appropriate to isolate electrically both current-measurement components for measuring one or more phase currents flowing in the phase conductor(s) and also voltage-measurement components for measuring one or more phase voltages on the phase conductor(s). Specifically, for each phase conductor, the phase voltage is acquired directly on the phase conductor, whereas the phase current is acquired via the external transformer. The current-measurement components and the voltage-measurement components are thus isolated in independent and distinct manner, and large potential differences can exist between their reference grounds.

Such a meter must also comply with accuracy requirements that are relatively stringent. The accuracy to be achieved by a class D meter is typically equal to ±0.2%.

In order to satisfy those isolation and accuracy requirements, the designers of meters nowadays have a choice between two known solutions.

A first solution consists in using one or more Rogowski sensors in the current-measurement components. It is then very complicated to make the meter comply with requirements for immunity against disturbances in the frequency range of 2 kilohertz (kHz) to 150 kHz. Specifically, Rogowski sensors are current differentiators, and once they have been differentiated, such disturbances have amplitudes that are proportional to their frequencies.

A second solution consists in using internal current transformers in the current-measurement components, with relatively accurate current sensors being connected to those transformers. Nevertheless, such internal current transformers present temperature drift. Compensating that temperature drift in order to comply with the accuracy requirements associated with a class D meter is complicated to achieve.

It should also be observed that both the first and the second solutions are generally implemented using components that are mainly analog, and that tend to drift over time.

OBJECT OF THE INVENTION

An object of the invention is to provide an electricity meter that complies with the accuracy requirements conventionally associated with meters of class D.

SUMMARY OF THE INVENTION

In order to achieve this object, there is provided an electricity meter including a current-measurement circuit arranged to measure a phase current flowing in a phase conductor of a distribution network and a voltage-measurement circuit arranged to measure a phase voltage on the phase conductor, the current-measurement circuit comprising a current sensor producing a first analog measurement voltage representative of the phase current and a first analog-to-digital converter arranged to take first samples of the first analog measurement voltage so as to produce first digital values, the voltage-measurement circuit comprising a voltage sensor producing a second analog measurement voltage representative of the phase voltage and a second analog-to-digital converter arranged to take second samples of the second analog measurement voltage so as to produce second digital values, the electricity meter further comprising a first synchronization circuit arranged to synchronize in frequency the taking of the first samples and of the second samples.

By synchronizing the taking of the first samples of the first analog measurement voltage representative of the phase current in frequency with the taking of the second samples of the second analog measurement voltage representative of the phase voltage it is possible to obtain first digital values and second digital values that are synchronized in frequency.

This improves the accuracy with which power is estimated, and thus the accuracy of the estimate of the quantity of electrical energy that is consumed by the installation in which the electricity meter is integrated.

There is also provided an electricity meter as described above, wherein the current measurement circuit includes a current-measurement module that includes the current sensor and that is electrically isolated from the voltage-measurement circuit.

In a particular embodiment, the electrical isolation between the current-measurement module and the voltage-measurement circuit is obtained by an isolation barrier integrated in the first analog-to-digital converter.

The current-measurement module is thus electrically isolated from the voltage-measurement circuit without requiring the use of a Rogowski sensor or of an internal current transformer, thereby avoiding the drawbacks associated with those two solutions.

In a particular embodiment, the current sensor comprises a shunt and the voltage sensor comprises a voltage divider bridge.

The use of a shunt, or of a plurality of shunts in a polyphase meter, enables disturbances in a frequency range of 2 kHz to 150 kHz to be processed under good conditions. Furthermore, shunts are not very sensitive to temperature variations.

It should be observed that, in the electricity meter of the invention, measurements are processed mainly by components that are digital (first analog-to-digital converter, second analog-to-digital converter possibly integrated in a digital processor component, etc.), which components are subjected to very little drift over time.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
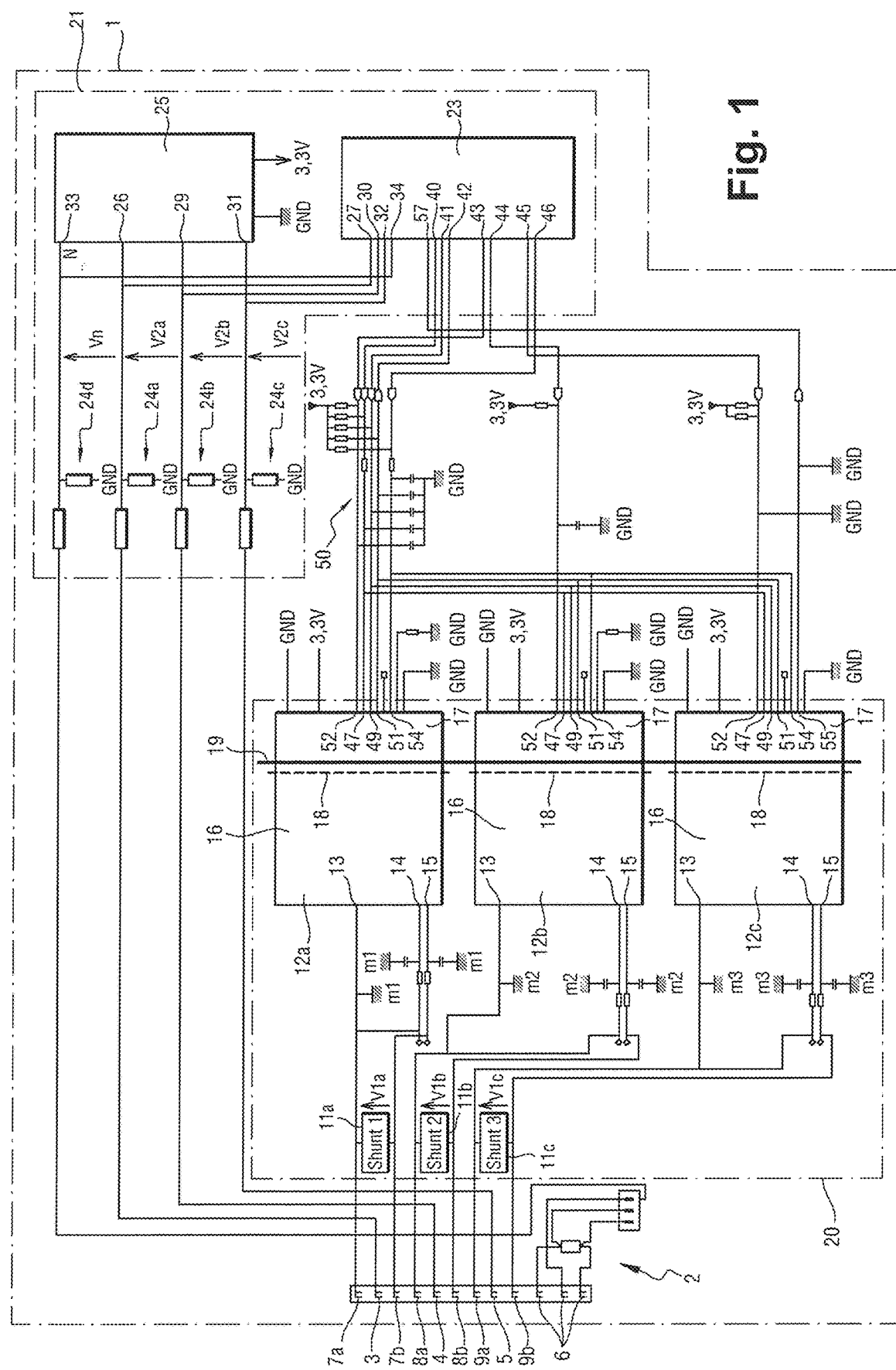
FIG. 1 is a circuit diagram of an electricity meter of the invention.

With reference to FIG. 1, the electricity meter 1 of the invention in this example is an industrial three-phase electricity meter. The meter is a class D meter.

The meter 1 is for measuring the quantity of electrical energy that is supplied to an industrial electrical installation by a three-phase distribution network.

The meter 1 is connected to a first phase conductor of the network via a first external transformer having a primary with terminals connected to the first phase conductor, to a second phase conductor of the network via a second external transformer having a primary with terminals connected to the second phase conductor, and to a third phase conductor of the network via a third external transformer having a primary with terminals connected to the third phase conductor. The meter 1 is also connected to a neutral conductor of the network.

The meter 1 firstly includes a terminal block 2 comprising a first voltage port 3, a second voltage port 4, a third voltage port 5, neutral ports 6, upstream and downstream first current ports 7a and 7b, upstream and downstream second current ports 8a and 8b, and upstream and downstream third current ports 9a and 9b.

When the meter 1 is connected to the network, the first voltage port 3 is connected to the first phase conductor, the second voltage port 4 is connected to the second phase conductor, and the third voltage port 5 is connected to the third phase conductor.

A secondary of the first external transformer presents first and second terminals connected respectively to the upstream and downstream first current ports 7a and 7b, a secondary of the second external transformer presents first and second terminals connected respectively to the upstream and downstream second current ports 8a and 8b, and a secondary of the third external transformer presents first and second terminals connected respectively to the upstream and downstream third current ports 9a and 9b. The neutral ports 6 are connected to the neutral conductor of the network.

The meter 1 further includes a current-measurement circuit 20.

The current-measurement circuit 20 comprises three current sensors, specifically three shunts 11, and three first analog-to-digital converters 12.

A first shunt 11a is connected between the upstream and downstream first current ports 7a and 7b. A second shunt 11b is connected between the upstream and downstream second current ports 8a and 8b. A third shunt 11c is connected between the upstream and downstream third current ports 9a and 9b.

A first analog measurement voltage V1a is generated across the terminals of the first shunt 11a. The first analog measurement voltage V1a is representative of a first phase current flowing in the first phase conductor. A first analog-to-digital converter 12a has a first input pin 13 and a second input pin 14 both connected to a first terminal of the first shunt 11a, and a third input pin 15 connected to a second terminal of the first shunt 11a. In this example, a "pin" may be a pin of any suitable component (analog-to-digital converter, microcontroller, etc.), regardless of the type of package of that component.

The first analog-to-digital converter 12a uses a first reference ground m1 taken from a conductor connecting together the upstream first current port 7a, one of the terminals of the first shunt 11a, and the first input 13 of the first analog-to-digital converter 12a.

A first analog measurement voltage V1b is generated across the terminals of the second shunt 11b. The first analog measurement voltage V1b is representative of a second phase current flowing in the second phase conductor. A first analog-to-digital converter 12b has a first input pin 13 and a second input pin 14 both connected to a first terminal of the second shunt 11b, and a third input pin 15 connected to a second terminal of the second shunt 11b. The first analog-to-digital converter 12b uses a second reference ground m2 taken from a conductor connecting together the upstream second current port 8a, one of the terminals of the second shunt 11b, and the first input 13 of the first analog-to-digital converter 12b.

A first analog measurement voltage V1c is generated across the terminals of the third shunt 11c. The third analog measurement voltage V1c is representative of a third phase current flowing in the third phase conductor. A first analog-to-digital converter 12c has a first input pin 13 and a second input pin 14 both connected to a first terminal of the third shunt 11c, and a third input pin 15 connected to a second terminal of the third shunt 11c. The first analog-to-digital converter 12c uses a third reference ground m3 taken from a conductor connecting together the upstream third current port 9a, one of the terminals of the third shunt 11c, and the first input 13 of the first analog-to-digital converter 12c.

The first reference ground m1, the second reference ground m2, and the third reference ground m3 are distinct and isolated from one another.

Each first analog-to-digital converter 12 acquires a first analog measurement voltage V1 applied to its second input pin 14 and its third input pin 15, and it takes first samples of the first analog measurement voltage V1 so as to obtain first digital values.

In this example, the three first analog-to-digital converters 12 are sigma delta converters. An example of a component suitable for use for the first analog-to-digital converters 12 has the reference ADE7912 (Analog Device).

Each first analog-to-digital converter 12 has an input stage 16 and an output stage 17 that are isolated from each other by an isolation barrier 18. The isolation barrier 18 comprises an isolation transformer having an air gap of about 8 millimeters (mm). The isolation barrier 18 is effective for root mean square (rms) alternating current (AC) voltages up to 5 kilovolts (kV).

An overall isolation barrier 19 is thus defined by the isolation barriers 18 of the three first analog-to-digital converters 12. The overall isolation barrier 19 thus isolates the current-measurement module electrically from the output module.

The current measurement module is situated upstream from the overall isolation barrier 19 (on the same side as the network), and the output module is situated downstream from the overall isolation barrier 19 (on the same side as the industrial electrical installation).

The current measurement module includes the three shunts 11 and the input stages 16 of the three first analog-to-digital converters 12. The output module includes the output stages 17 of the three first analog-to-digital converters 12.

The meter 1 further includes a voltage-measurement circuit 21.

The voltage-measurement circuit 21 comprises a processor component having integrated therein a second analogto-digital converter, voltage sensors, specifically four voltage divider bridges 24, and a power supply component 25.

In this example, the processor component is a microcontroller 23, however it could be some other component, e.g. a field programmable gate array (FPGA). An example of a component suitable for use for the microcontroller 23 has the reference STM32F105 (STMicroelectronics).

The microcontroller 23 and the power supply component 25 make use of a fourth reference ground GND defined inside the meter 1 (and isolated from the reference grounds m1, m2, and m3).

A first input pin 26 of the power supply component 25 and a first input pin 27 of the microcontroller 23 are connected to the first voltage port 3 via a first voltage divider bridge 24a comprising two resistors. The first voltage divider bridge 24a makes use of the fourth reference ground GND.

A second input pin 29 of the power supply component 25 and a second input pin 30 of the microcontroller 23 are connected to the second voltage port 4 via a second voltage divider bridge 24b comprising two resistors. The second voltage divider bridge 24b makes use of the fourth reference ground GND.

A third input pin 31 of the power supply component 25 and a third input pin 32 of the microcontroller 23 are connected to the third voltage port 5 via a third voltage divider bridge 24c comprising two resistors. The third voltage divider bridge 24c makes use of the fourth reference ground GND.

A fourth input pin 33 of the power supply component 25 and a fourth input pin 34 of the microcontroller 23 are connected to one of the neutral ports 6 via a fourth voltage divider bridge 24d comprising two resistors. The fourth voltage divider bridge 24d makes use of the fourth reference ground GND.

A second analog measurement voltage V2a is generated at the output of the first voltage divider bridge 24a. The second analog measurement voltage V2a is representative of the voltage of the first phase on the first phase conductor. The microcontroller 23 acquires the second analog measurement voltage V2a and transmits it to the second analog-to-digital converter.

A second analog measurement voltage V2b is generated at the output of the second voltage divider bridge 24b. The second analog measurement voltage V2b is representative of the voltage of the second phase on the second phase conductor. The microcontroller 23 acquires the second analog measurement voltage V2b and transmits it to the second analog-to-digital converter.

A second analog measurement voltage V2c is generated at the output of the third voltage divider bridge 24c. The second analog measurement voltage V2c is representative of the voltage of the third phase on the third phase conductor. The microcontroller 23 acquires the second analog measurement voltage V2c and transmits it to the second analog-to-digital converter.

A neutral analog measurement voltage Vn is generated at the output of the fourth voltage divider bridge 24d. The neutral analog measurement voltage Vn is representative of the neutral voltage. The microcontroller 23 acquires the neutral analog measurement voltage Vn and transmits it to the second analog-to-digital converter.

The second analog-to-digital converter thus acquires the second analog measurement voltages V2, and takes second samples of each second analog measurement voltage V2 so as to obtain second digital values.

The power supply component 25 uses the second analog measurement voltages V2 to produce a power supply voltage, which in this example is equal to 3.3 volts (V). The power supply voltage powers in particular the microcontroller 23 and the three first analog-to-digital converters 12 (via their output stage 17).

It should be observed that the current measurement module of the current measurement circuit 20 is isolated electrically from the voltage measurement circuit 21 by the overall isolation barrier 19.

The description continues with the electrical connections between the microcontroller 23 and the three first analog-to-digital converters 12.

The microcontroller 23 has an SPI clock (SCK) pin 40, a master input, slave output (MISO) pin 41, a master output, slave input (MOSI) pin 42, a chip select one (CS1) pin 43, a chip select two (CS2) pin 44, a chip select three (CS3) pin 45, a clock (CLK) pin 46, and a timing pin 57.

The SCK pin 40 of the microcontroller 23 is connected to an SCLK pin 47 of the first analog-to-digital converter 12a, to an SCLK pin 47 of the first analog-to-digital converter 12b, and to an SCLK pin 47 of the first analog-to-digital converter 12c.

The MISO pin 41 of the microcontroller 23 is connected to an MISO pin 49 of the first analog-to-digital converter 12a, to an MISO pin 49 of the first analog-to-digital converter 12b, and to an MISO pin 49 of the first analog-to-digital converter 12c.

The MOSI pin 42 of the microcontroller 23 is connected to an MOSI pin 51 of the first analog-to-digital converter 12a, to an MOSI pin 51 of the first analog-to-digital converter 12b, and to an MOSI pin 51 of the first analog-to-digital converter 12c.

The CS1 pin 43 of the microcontroller 23 is connected to a CS pin 52 of the first analog-to-digital converter 12a, the CS2 pin 44 of the microcontroller 23 is connected to a CS pin 52 of the first analog-to-digital converter 12b, and the CS3 pin 45 of the microcontroller 23 is connected to a CS pin 52 of the first analog-to-digital converter 12c.

Thus, the microcontroller 23 and the three first analog-to-digital converters 12 are connected together by a digital bus, specifically an SPI bus 50.

The CLK pin 46 of the microcontroller 23 is connected to a synchronization pin 54 of the first analog-to-digital converter 12a, to a synchronization pin 54 of the first analog-to-digital converter 12b, and to a synchronization pin 54 of the first analog-to-digital converter 12c.

An availability pin 55 of the first analog-to-digital converter 12c is connected to the timing pin 57 of the microcontroller 23.

The three first analog-to-digital converters 12 are synchronized in frequency by the microcontroller 23 via the SPI bus 50. The microcontroller 23 produces a clock signal on its CLK pin 46. In this example, the frequency of the clock signal is equal to 4 megahertz (MHz) (but it could naturally be different). Each of the three first analog-to-digital converters 12 uses the clock signal to control the timing of the taking of a respective first sample, such that the three first analog-to-digital converters 12 are synchronized with one another in frequency.

Furthermore, the microcontroller 23 issues simultaneous synchronization commands on its CS1 pin 43, its CS2 pin 44, and its CS3 pin 45. All three first analog-to-digital converters 12 thus receive the synchronization command simultaneously on their CS pins 52.

However, each first analog-to-digital converter 12 incorporates a counter enabling it to adjust the phase instant at which it takes a first sample. When the internal counters of the three first analog-to-digital converters 12 all have the same value, the three first analog-to-digital converters 12 are synchronized in phase.

In this example, the internal counters of the three first analog-to-digital converters 12 are reset to 0 at the same instant by the synchronization commands, such that the three first analog-to-digital converters 12 are synchronized in phase.

The meter 1 includes a first synchronization circuit arranged to synchronize in frequency the taking of the first samples as performed by each first analog-to-digital converter with the taking of the second samples as performed by the second analog-to-digital converter of the microcontroller 23.

In this example, the first synchronization circuit comprises a digital bus, specifically the SPI bus 50, and it operates as follows.

Each first analog-to-digital converter 12 is arranged to issue timing signals on the SPI bus 50, which timing signals are representative of a first frequency for taking first samples.

These timing signals comprise pulses. A pulse is generated by a first analog-to-digital converter 12 when a first digital value is ready, each first digital value resulting from taking a first sample and being representative of the value of the first analog measurement voltage V1 as digitized by the first analog-to-digital converter 12 in question (i.e. the first analog measurement voltage V1a for the first analog-to-digital converter 12a, the first analog measurement voltage V1b for the first analog-to-digital converter 12b, and the first analog measurement voltage V1c for the first analog-to-digital converter 12c).

These timing signals are labelled "DATA READY" signals in the datasheet for the ADE7912.

The timing signals are generated by each first analog-to-digital converter 12 on its availability pin.

However, the availability pin 55 of the first analog-to-digital converter 12c is connected to the timing pin 57 of the microcontroller 23.

The microcontroller 23 thus acquires the timing signals on its timing pin 57 and launches taking of the second sample on the basis of the timing signals. Internally to the microcontroller 23, the timing signals generate an interrupt on an edge of the incoming timing signals, thereby causing second samples to be taken of the second analog measurement voltages V2.

The taking of the first samples and the taking of the second samples are thus synchronized in frequency.

It should be observed that it suffices for the availability pin 55 of only one first analog-to-digital converter 12 (specifically of the first analog-to-digital converter 12c) to be connected to the timing pin 57 of the microcontroller 23, since all three first analog-to-digital converters 12 are frequency synchronized with one another.

Using the timing signals and the availability pin 55 of the first analog-to-digital converter 12c thus constitutes a highly advantageous solution for performing frequency synchronization in practical manner, and it is also particularly innovative, since the availability pin 55 (also known as the CLKOUT/DREADY pin) is not in any way provided for this purpose.

The first synchronization circuit serves to synchronize the taking of the first and second samples in frequency, but not in phase. The samples of the second analog measurement voltages V2 are taken with a short delay relative to the taking of the samples of the first analog measurement voltages V1, which short delay produces a measurement phase offset between the first digital values and the second digital values.

In order to compensate for the measurement phase offset and further improve the accuracy of measurement, the meter 1 includes a second synchronization circuit.

The second synchronization circuit serves to compensate for the measurement phase offset by determining a compensation phase offset that is to be applied between the current measurements and the voltage measurements.

The following are thus determined: a first compensation phase offset $\Delta\varphi 1$ for the first phase conductor, a second compensation phase offset $\Delta\varphi 2$ for the second phase conductor, and a third compensation phase offset $\Delta\varphi 3$ for the third phase conductor.

The second synchronization circuit includes a memory in which calibration parameters are stored. The calibration parameters comprise the first compensation phase offset $\Delta\varphi 1$ and a first compensation gain K1, the second compensation phase offset $\Delta\varphi 2$ and a second compensation gain K2, and the third compensation phase offset $\Delta\varphi 3$ and a third compensation gain K3. For each phase conductor, the compensation gain K serves to compensate for a gain difference due to the current-measurement circuit 20 and the voltage-measurement circuit 21.

The calibration parameters are obtained before the meter 1 is put into service, i.e. while it is being manufactured or assembled, or else at the time it is installed. Thereafter, while the meter 1 is in operation, the microcontroller 23 applies the compensation phase offset and the compensation gain to the first and second digital values that are associated with each phase conductor.

For each phase conductor, the compensation phase offset zq and the associated compensation gain K are obtained as follows.

Figure 2:
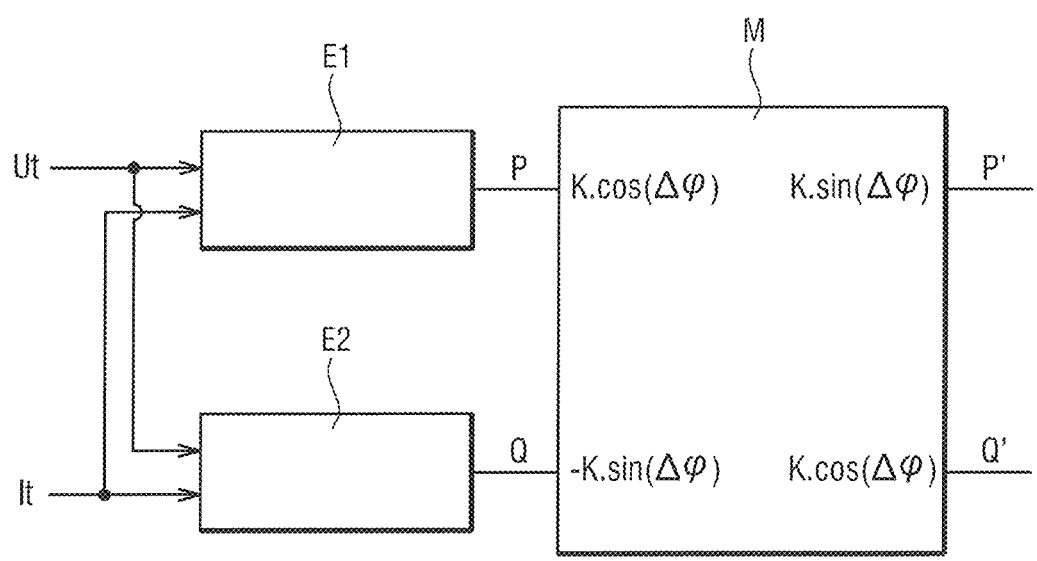
FIG. 2 shows steps for calibrating the electricity meter of the invention.

With reference to FIG. 2, a test current It of 1 A is injected into each phase conductor at a test voltage Ut of 230 V. The test current It and the test voltage Ut are in phase.

The test current It is thus injected into the input of the current-measurement circuit 20 at the test voltage Vt, which is applied to the input of the voltage-measurement circuit 21.

The current-measurement circuit 20 and the voltage-measurement circuit 21 are then used to measure active and reactive power values in order to obtain a measured raw active power P (step E1) and a measured raw reactive power Q (step E2).

In the absence of any measurement phase offset, the active power consumed would be equal to 230 W, i.e. to Ut.It, and the reactive power would be 0 W.

Thus, by introducing the compensation phase offset $\Delta\varphi$, a compensated active power P' should be obtained that is equal to 230 W and a compensated reactive power Q' should be obtained that is equal to 0 W.

However, introducing the compensation phase offset zq on P and Q in order to obtain P' and Q' amounts to performing the following multiplication:

$$\begin{pmatrix} P' \\ Q' \end{pmatrix} = M \cdot \begin{pmatrix} P \\ Q \end{pmatrix}.$$

The following equations are obtained:

$P'=K.\cos(\Delta\varphi).P+K.\sin(\Delta\varphi).Q$ and $Q'=-K.\sin(\Delta\varphi).P+K.\cos(\Delta\varphi).Q$, where P is the measured raw active power, Q is the measured raw reactive power, P' is the compensated active power, such that P'=Ut.It, where Ut is the test voltage and It is the test current, and Q' is the compensated reactive power, such that Q'=0.

The compensation gain K serves to compensate for a gain difference between firstly the measured raw active power P and the measured raw reactive power Q, and secondly a compensated active power P' and a compensated reactive power Q'.

There are thus two equations in two unknowns, thereby making it possible to determine $\Delta\varphi$ and K.

These operations are performed for each phase conductor. This serves to obtain the first compensation phase offset zpl and the first compensation gain K1, the second compensation phase offset $\Delta\varphi2$ and the second compensation gain K2, and the third compensation phase offset $\Delta\varphi3$ and the third compensation gain K3.

Naturally, the invention is not limited to the embodiment described, but covers any variant coming within the ambit of the invention as defined by the claims.

Although the meter described herein is a three-phase meter, the invention naturally applies to a single-phase meter or to any polyphase meter. Each phase conductor is then associated with a respective current sensor and its first analog-to-digital converter, and with a voltage sensor.

Instead of using a single second analog-to-digital converter, it would naturally possible to use a respective second analog-to-digital converter for each phase conductor, and it would equally be possible to use only a single first analog-to-digital converter in the single-phase situation.

The current sensors and the voltage sensors could be other than the shunts and the voltage divider bridges described herein.

In the description above, the first synchronization circuit comprises a digital bus, specifically the SPI bus 50, and each first analog-to-digital converter 12 is arranged to issue timing signals on the SPI bus 50, which signals are representative of a first frequency for taking first samples. When a plurality of first analog-to-digital converters are used, the timing signals could be issued by only one of the first analog-to-digital converters, or else by only some of them.

Alternatively, in order to synchronize the taking of the first and second samples in frequency, each second analog-to-digital converter could be arranged to issue timing signals on the digital bus, which signals would be representative of a second frequency for taking second samples. When a plurality of second analog-to-digital converters are used, the timing signals could be issued by only one of the second analog-to-digital converters, or else by only some of them.

The invention claimed is:

1. An electricity meter comprising a current-measurement circuit arranged to measure a phase current flowing in a phase conductor of a distribution network and a voltage-measurement circuit arranged to measure a phase voltage on the phase conductor, the current-measurement circuit comprising a current sensor producing a first analog measurement voltage representative of the phase current and a first analog-to-digital converter arranged to take first samples of the first analog measurement voltage so as to produce first digital values, the voltage-measurement circuit comprising a voltage sensor producing a second analog measurement voltage representative of the phase voltage and a second analog-to-digital converter arranged to take second samples of the second analog measurement voltage so as to produce second digital values, the electricity meter further comprising a first synchronization circuit arranged to synchronize in frequency the taking of the first samples and of the second samples, the first synchronization circuit comprising a digital bus, the first analog-to-digital converter being arranged to issue, on the digital bus, timing signals representative of a first frequency for taking the first samples, or the second analog-to-digital converter being arranged to issue, on the digital bus, timing signals representative of a second frequency for taking the second samples.

2. The electricity meter according to claim 1, the first analog-to-digital converter being arranged to issue, on the digital bus, the timing signals representative of the first frequency for taking the first samples.

3. The electricity meter according to claim 2, wherein the second analog-to-digital converter is integrated in a processor component arranged to acquire the timing signals and to control the timing of the operation of the second analog-to-digital converter on the basis of the timing signals, such that a second frequency for taking the second samples is equal to the first frequency.

4. The electricity meter according to claim 3, the electricity meter being a poly-phase meter connected to a plurality of phase conductors, the electricity meter comprising a respective current sensor and a respective first analog-to-digital converter that are associated with each phase conductor, the first analog-to-digital converters being synchronized in frequency and in phase by the processor component via the digital bus.

5. The electricity meter according to claim 2, wherein the timing signals comprise pulses, each pulse being generated when a first digital value is ready.

6. The electricity meter according to claim 1, further comprising a second synchronization circuit arranged to synchronize in phase the taking of the first samples and of the second samples.

7. The electricity meter according to claim 6, wherein the second synchronization circuit includes a memory storing calibration parameters comprising a compensation phase offset ($\Delta\varphi$) for application between the first digital values and the second digital values.

8. The electricity meter according to claim 7, wherein the calibration parameters are obtained by injecting a test current (It) as input to the current-measurement circuit at a test voltage (Ut) applied as input to the voltage-measurement circuit, by measuring active and reactive power values in order to obtain a measured raw active power (P) and a measured raw reactive power (Q), and by estimating the compensation phase offset from the measured raw active power and the measured raw reactive power.

9. The electricity meter according to claim 8, wherein the calibration parameters further comprise a compensation gain (K) serving to compensate a gain difference between firstly the measured raw active power (P) and the measured raw reactive power (Q), and secondly a compensated active power (P') and a compensated reactive power (Q').

10. The electricity meter according to claim 9, wherein the calibration parameters are obtained by using the following equations:

$$P'=K.\cos(\Delta\varphi).P+K.\sin(\Delta\varphi).Q \text{ and}$$

$$Q'=-K.\sin(\Delta\varphi).P+K.\cos(\Delta\varphi).Q,$$

where P is the measured raw active power, Q is the measured raw reactive power, P' is the compensated active power, such that P'=Ut.It, where Ut is the test voltage and It is the test current, Q' is the compensated reactive power, such that Q'=0, $\Delta\varphi$ is the compensation phase offset, and K is the compensation gain.

11. The electricity meter according to claim 1, wherein the current measurement circuit includes a current-measurement module that includes the current sensor and that is electrically isolated from the voltage-measurement circuit.

12. The electricity meter according to claim 11, wherein electrical isolation between the current-measurement module and the voltage-measurement circuit is obtained by an isolation barrier integrated in the first analog-to-digital converter.

13. The electricity meter according to claim 1, the current sensor comprising a shunt and the voltage sensor comprising a voltage divider bridge.

* * * * *